US008410579B2

(12) United States Patent
Ghia et al.

(10) Patent No.: US 8,410,579 B2
(45) Date of Patent: Apr. 2, 2013

(54) POWER DISTRIBUTION NETWORK

(75) Inventors: Atul V. Ghia, San Jose, CA (US);
Christopher P. Wyland, Livermore, CA (US); Ketan Sodha, Fremont, CA (US);
Paul T. Sasaki, Sunnyvale, CA (US);
Jian Tan, Fremont, CA (US); Paul Y. Wu, Saratoga, CA (US); Romi Mayder, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 261 days.

(21) Appl. No.: 12/962,613

(22) Filed: Dec. 7, 2010

(65) Prior Publication Data
US 2012/0139083 A1 Jun. 7, 2012

(51) Int. Cl.
*H01L 23/64* (2006.01)
*H01L 21/02* (2006.01)

(52) U.S. Cl. ........... 257/535; 257/E29.343; 257/21.008; 438/396

(58) Field of Classification Search ................ 257/535
See application file for complete search history.

(56) References Cited

U.S. PATENT DOCUMENTS 6,777,776 B2 * 8/2004 Hieda ........................... 257/532
2003/0197430 A1 10/2003 Gauthier et al.
2006/0197184 A1 * 9/2006 Oi et al. ....................... 257/532
2007/0267720 A1 * 11/2007 Toda et al. ................... 257/532
2008/0186654 A1 8/2008 Takeshima et al.
2010/0127348 A1 5/2010 Quinn
2010/0283123 A1 * 11/2010 Shiu ............................. 257/532

OTHER PUBLICATIONS

Alexander, Mark, "Power Distribution System (PDS) Design Using Bypass/Decoupling Capacitors", Application Note: Virtex-II Series, XAPP623 (v2.1) Feb. 28, 2005, pp. 1-27, Xilinx, Inc. San Jose, CA 95124 USA.
Xilinx, Inc., "Spartan-6 FPGA PCB Design and Pin Planning Guide", User Guide, UG393 (v1.2) Jul. 15, 2010, pp. 1-72, Xilinx, Inc., San Jose, CA 95124 USA.

* cited by examiner

*Primary Examiner* — Stephen W Smoot
(74) *Attorney, Agent, or Firm* — LeRoy D. Maunu

(57) ABSTRACT

In one embodiment, an integrated circuit (IC) is presented. The IC includes first and second sets of power distribution lines formed in the IC. The IC includes first and second capacitors formed in one or more layers of the IC. A first plurality of vias couple a first input of the first and second capacitors to the first set of power distribution lines, and a second plurality of vias couple a second input of the first and second capacitors to the second set of power distribution lines. The first capacitor and the first plurality of vias and the second plurality of vias coupled thereto having an equivalent series resistance greater than an equivalent series resistance of the second capacitor and the first plurality of vias and the second plurality of vias coupled thereto.

20 Claims, 5 Drawing Sheets

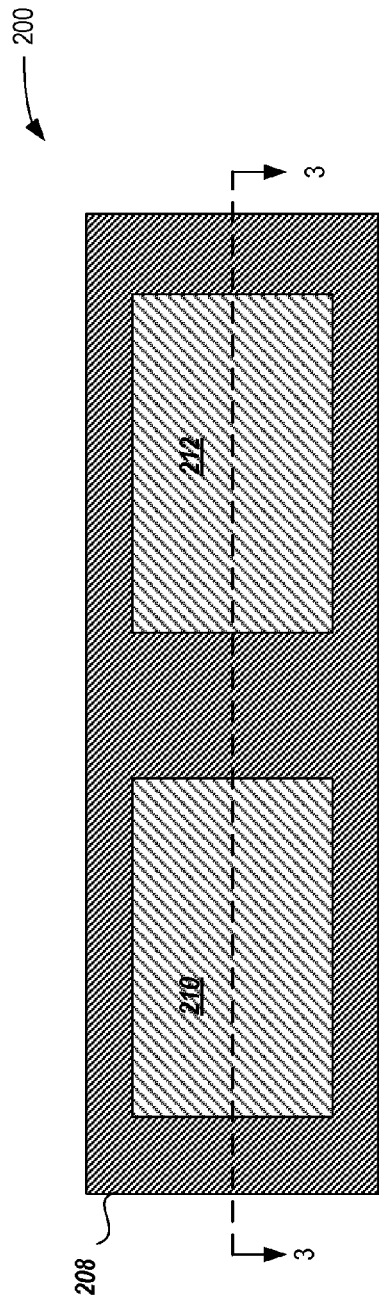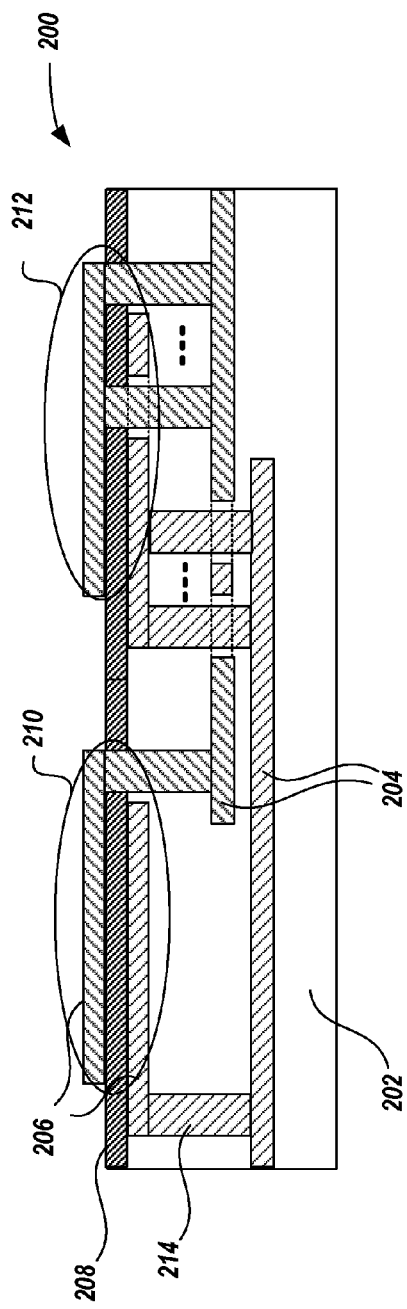
FIG. 2
FIG. 3

POWER DISTRIBUTION NETWORK

FIELD OF THE INVENTION

One or more embodiments generally relate to power distribution networks for integrated circuits (ICs).

BACKGROUND

Electrical systems often include semiconductor devices with very demanding power requirements (e.g. providing for high current transients with stable voltage over a wide frequency range). A power regulation circuit located on a printed circuit board (PCB) typically generates the voltage used to drive components of an IC. The power regulation circuit observes the regulated output voltage and adjusts the amount of current supplied to keep the voltage constant. The generated voltage is delivered from the regulator to the components by means of a power distribution network (PDN). A PDN includes not only the output ports of a power regulation circuit, but also power distribution lines on the printed circuit board (PCB), additional components mounted on the PCB, the package of the semiconductor IC, and power distribution lines of the IC.

PDNs are configured to accommodate current demands of integrated circuit components and respond to transient changes in these demands as quickly as possible. When the current draw in a device changes, the power regulation circuit may not be able to respond to that change instantaneously. For example, most voltage regulators adjust the output voltage on the order of milliseconds to microseconds. They are effective at maintaining output voltage for events at all frequencies from DC to a few hundred kilohertz (depending on the regulator). For all transient events that occur at frequencies above this range, there is a time lag before the voltage regulator can respond to the new level of demand. The PDN should be configured to accommodate for this lag. The voltage fluctuations, referred to herein as ripple, can affect timing of the circuit because a perturbed supply voltage modifies the delay of components such as logic gates or interconnects. If the modified delays are not accounted for, the design may not perform as intended.

The power consumed by a digital device varies over time and may occur at all frequencies of operation. Low frequency variance of current is usually the result of devices or large portions of devices being enabled or disabled. Similarly, high frequency variance of current often results from individual switching events of components of the IC. These switching events occur on the scale of the clock frequency as well as the first few harmonics of the clock frequency. In addition to ripple resulting from component switching, non-linear electrical characteristics of the components create additional fluctuations in voltage. These effects were generally ignored in older technologies because of relative slow chip speed and low integration density. However, as speed and density of circuits increase, the unintended effects caused by the parasitic electrical characteristics of components have become significant. Among other effects, inductance of various portions of the PDN, in combination with capacitance of the PDN, can resonate when perturbed.

PDN design for programmable ICs is particularly difficult because transient currents may vary widely depending on the design used to configure the programmable IC. Since programmable ICs can implement an almost infinite number of applications at undetermined frequencies and in multiple clock domains, it can be very complicated to predict transient current demands.

One or more embodiments of the present invention may address one or more of the above issues.

SUMMARY

In one embodiment, an integrated circuit (IC) is presented. The IC includes first and second sets of power distribution lines formed in the IC. The IC includes first and second capacitors formed in one or more layers of the IC. A first plurality of vias couple a first input of the first and second capacitors to the first set of power distribution lines, and a second plurality of vias couple a second input of the first and second capacitors to the second set of power distribution lines. The first capacitor and the first plurality of vias and the second plurality of vias coupled thereto have an equivalent series resistance greater than an equivalent series resistance of the second capacitor and the first plurality of vias and the second plurality of vias coupled thereto.

In another embodiment, an IC is provided. The IC includes first and second sets of power distribution lines and a plurality of capacitors. The IC also includes a plurality of sets of vias. Each set of vias includes one or more vias coupling a first end of a respective one of the plurality of capacitors to one or more of the first set of power distribution lines. Each set of vias also includes one or more vias coupling a second end of the respective one of the plurality of capacitors to one or more of the second set of power distribution lines. Each set in the plurality of sets of vias has a different number of vias.

In yet another embodiment, a method of fabricating an integrated circuit is provided. A first set and a second set of power distribution lines are formed in a semiconductor substrate. First and second capacitors are formed in one or more layers of the substrate. A first plurality of vias are formed, the first plurality of vias coupling a first input of the first and second capacitors to the first set of power distribution lines. A second plurality of vias are formed, the second plurality of vias coupling a second input of the first and second capacitors to the second set of power distribution lines. The first capacitor and the first plurality of vias and the second plurality of vias coupled thereto have an equivalent series resistance greater than an equivalent series resistance of the second capacitor and the first plurality of vias and the second plurality of vias coupled thereto.

It will be appreciated that one or more other embodiments are set forth in the Detailed Description and Claims which follow.

BRIEF DESCRIPTION OF THE DRAWINGS

Various aspects and advantages of one or more embodiments will become apparent upon review of the following detailed description and upon reference to the drawings in which:

FIG. 2 shows a top view of example on-chip decoupling capacitors;

FIG. 3 shows a cross-sectional view of the example on-chip decoupling capacitors of FIG. 2;

DETAILED DESCRIPTION OF THE DRAWINGS

Decoupling capacitors are used in PDNs to improve stability of power delivered to integrated circuit components. The decoupling capacitors provide a local backup supply of power to compensate for any current fluctuations. Decoupling capacitors may also be referred to as bypass capacitors and such terms are used interchangeably herein. However, decoupling capacitors are subject to limitations that may prevent instant compensation in response to ripple. While an ideal capacitor only has a capacitive characteristic, real non-ideal capacitors also have a parasitic inductance and a parasitic resistance. These parasitics act in series to form a resistance-inductance-capacitance (RLC) circuit. One problem associated with capacitors in a PDN is spikes in the PDN aggregate impedance. These spikes can be caused by a combination of capacitance and inductance in the PDN. If the power distribution lines have an especially low impedance, the crossover frequency between high-frequency decoupling capacitors and the capacitance of the power distribution lines may exhibit a high-impedance peak. Because impedance retards the abilities of bypass capacitors to quickly respond to changing current demands, if the IC has high transient current demand at this frequency, power supply noise may be created.

In one or more embodiments, the PDN implements decoupling using two or more decoupling capacitors on the IC to provide a smoother impedance profile. One of the decoupling capacitors, configured with a high equivalent series resistance (ESR), is included on the IC to reduce the effect of impedance spikes at parallel resonance frequencies. However, the high ESR capacitor alone may not provide a low-impedance path at high frequencies. This may cause the transient response of the first capacitor to be slower than desired for high-speed applications. In these embodiments, additional decoupling capacitors having lower ESRs are formed on the IC in parallel to provide lower impedance paths at incrementally higher respective frequencies.

Figure 1:
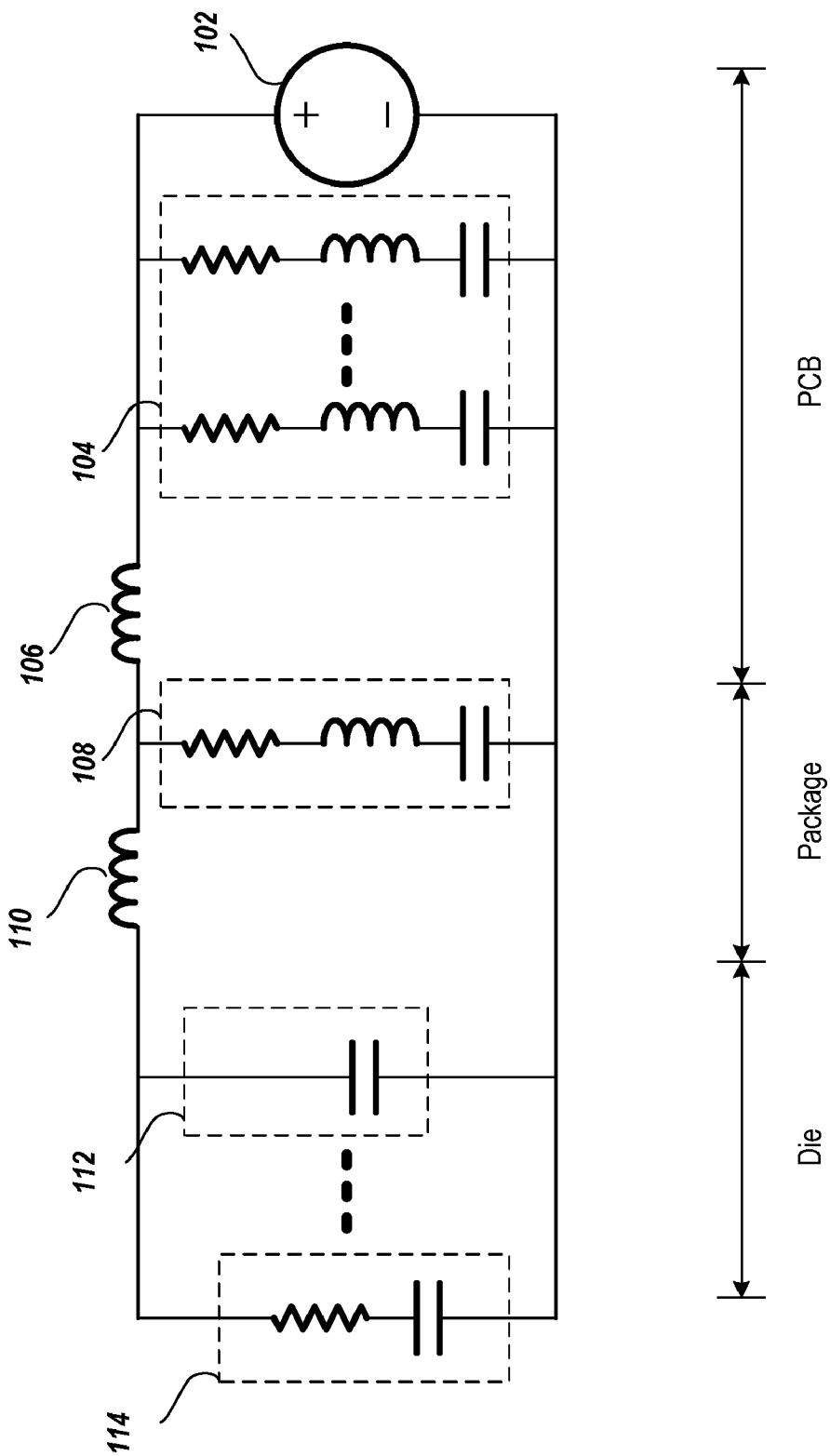
FIG. 1 shows a circuit diagram of a power distribution network.

FIG. 1 shows a circuit diagram of a PDN. As described above, a typical PDN includes three main segments: the IC die; the die package; and the printed circuit board (PCB) connecting a power regulation circuit 102 to the IC die package. The circuit shown in FIG. 1 provides a basic model of parasitic inductance and capacitance of the PDN. Capacitances and inductance of the PCB are respectively modeled by elements 104 and 106. Capacitances and inductance of the IC package are respectively modeled by elements 108 and 110. In this illustrative example, the PDN includes two decoupling capacitors formed on the IC. The first decoupling capacitor 114 is a high-ESR capacitor. The second decoupling capacitor 112 is a low ESR capacitor.

The ESR of a decoupling capacitor implemented on the IC can be adjusted by adjusting the resistance of the connection between the capacitor and the power distribution lines of the PDN. One or more embodiments arise from the recognition that if the capacitors are implemented in a separate layer of the IC, the ESR of each decoupling capacitor can be adjusted by adjusting the resistance of vias coupling the capacitor to the power distribution lines. Vias carry electrical signals or power between layers of an IC.

Previous PDNs generally place decoupling capacitors in the package to conserve available die space. In implementing the decoupling capacitors on a separate layer, the disclosed PDN arrangements allows a larger number of decoupling capacitors to be implemented on the IC die with less space restrictions.

FIGS. 2 and 3 show an example implementation of on-chip decoupling capacitors that may be used in accordance with one of more embodiments. FIG. 2 shows a top view of the IC 200 having two decoupling capacitors 210 and 212. FIG. 3 shows cross section of the IC shown in FIG. 2 taken in the direction 3. Power distribution lines 204 are formed in semiconductor substrate 202. In this example implementation, the decoupling capacitors are implemented as metal-insulator-metal capacitors. Each capacitor includes two metal plates 206 separated by a dielectric insulator 208. A first end of each capacitor 210 and 212 is coupled to a first one of the power distribution lines 204 with vias 214. A second end of each capacitor 210 and 212 is coupled to a second one of the power distribution lines 204 with vias 214. One skilled in the art will recognize that each end of the decoupling capacitor 212 is coupled to the power distribution lines 204 using two or more vias 214 coupled in parallel, whereas each end of the decoupling capacitor 210 is coupled to the power distribution line with one via 214. As a result, decoupling capacitor 212 has a lower ESR than decoupling capacitor 214.

For clarity of description, the embodiments depicted and described herein include two decoupling capacitors. In other embodiments and implementations, any number of decoupling capacitors may be included and coupled to the power distribution lines as shown in FIGS. 2 and 3. The decoupling capacitors are each coupled to the power distribution lines with a different number of vias 214. As a result, each capacitor can be configured to exhibit a different ESR to provide a smoother impedance response of the PDN across the entire frequency range.

One skilled in the art will recognize that other types of capacitors may also be used to implement the disclosed embodiments. For example, metal-insulator-metal capacitors may be implemented in one layer of the IC, with two interleaved comb shaped metal plates separated by a dielectric. Each capacitor may also be implemented with three or more stacked metal plates with the dielectric between the plates and neighboring plates coupled to different ones of the power distribution lines. Further details of metal-insulator-metal capacitors implemented on ICs are described in U.S. Pat. No. 6,144,225, which is incorporated herein by reference.

As another example, the decoupling capacitors may be implemented with MOSFET transistors formed in a layer of the IC. Different types and sizes of capacitors have different levels of effectiveness as decoupling capacitors for different frequency bands. In one or more embodiments, each capacitor may also be implemented with a different capacitance value to distribute the effective decoupling range among multiple capacitors and further smooth the impedance response of the PDN.

Figure 4:
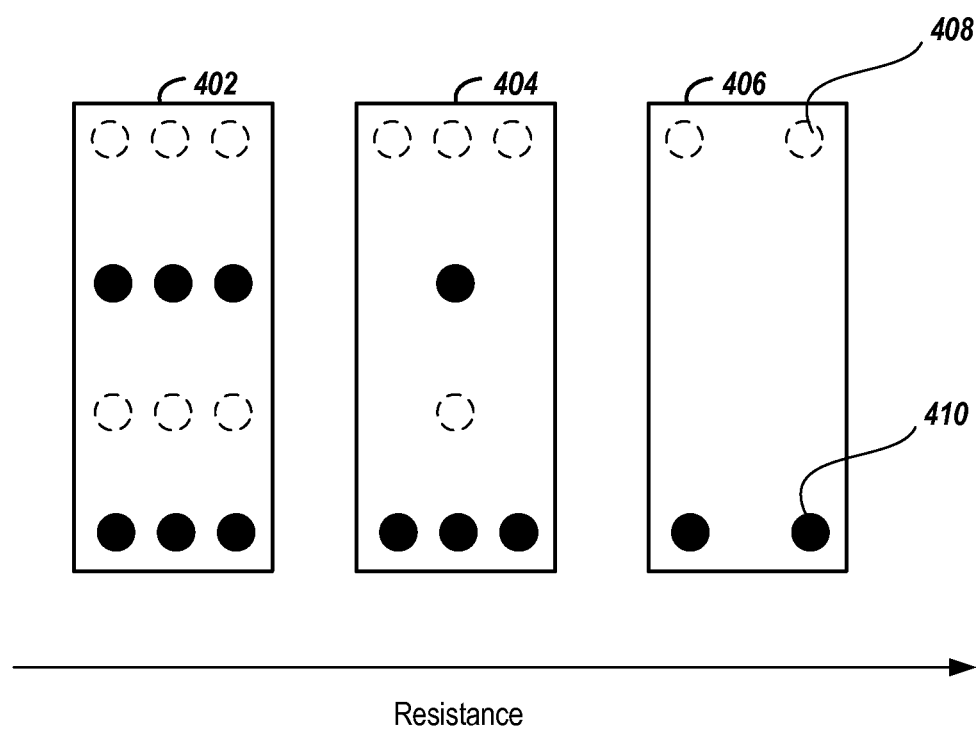
FIG. 4 illustrates adjustment of resistance of decoupling capacitors.

FIG. 4 illustrates adjustment of resistance of decoupling capacitors in accordance with one or more embodiments. This example shows a top view of three metal-insulator-metal decoupling capacitors 402, 404, and 406. Hashed circles 408 depict vias that connect one plate of each capacitor to power distribution lines, and solid circles 410 depict vias that connect the other plate of the capacitor power distribution lines.

The decoupling capacitors 402-406 are arranged from left to right with increasing ESR. Because the multiple vias connect plates of each capacitor in parallel to the power distribution lines, a larger number of vias results in a decrease of ESR. One skilled in the art will recognize that two or more vias may also be connected in series through one or more intermediate layers to increase resistance if required.

In one or more embodiments, one or more vias coupled to a decoupling capacitor are connected to a distribution power line by a programmable fuse. The electrical path provided by the one or more vias can be disabled by burning out the fuse. In this manner, the ESR of the capacitor may be adjusted after manufacture of the IC is completed.

Figure 5:
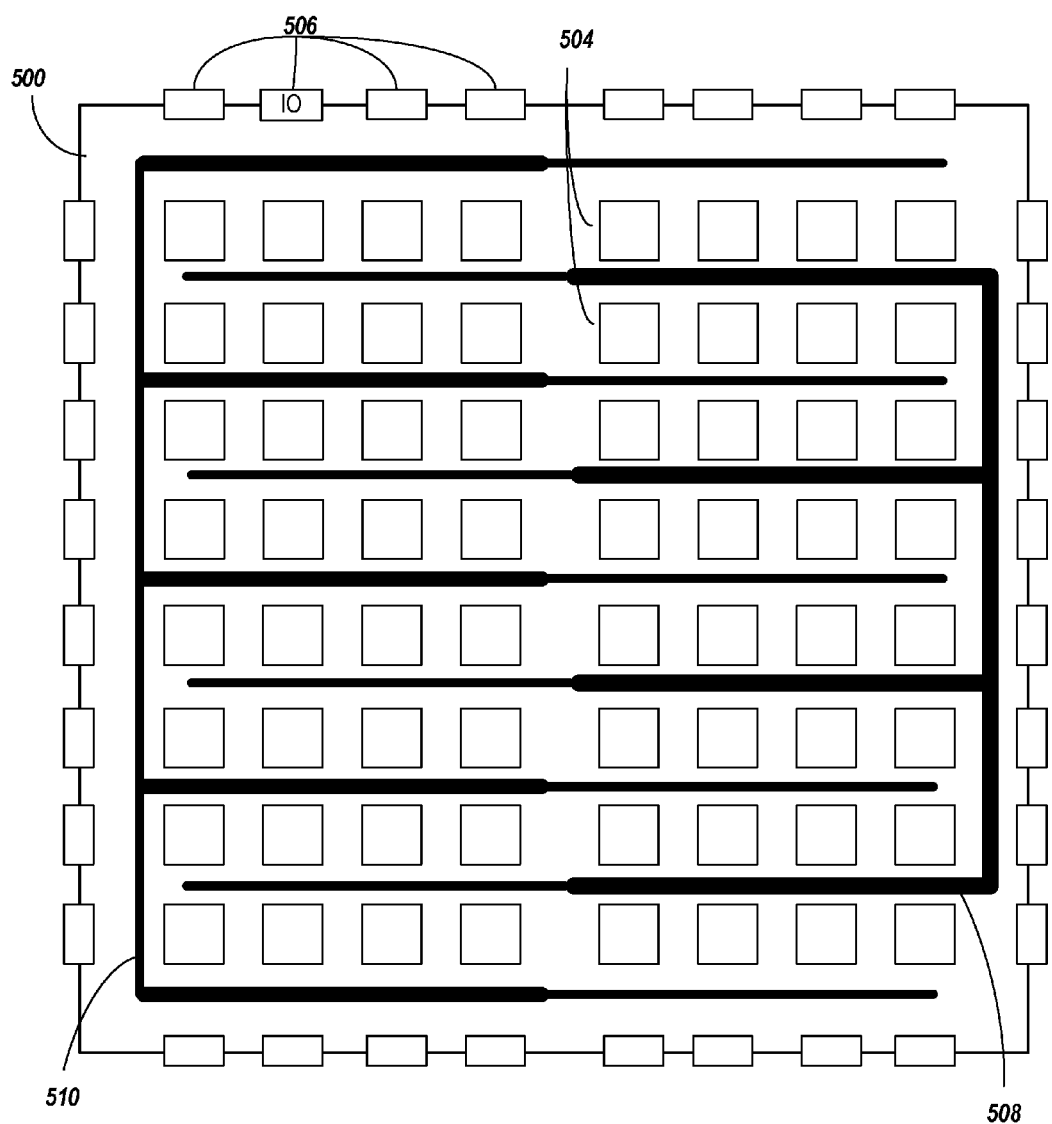
FIG. 5 illustrates an example power line distribution grid of a programmable IC.

FIG. 5 illustrates an example programmable integrated circuit in which the power distribution lines are located in the same plane as the programmable logic resources. The programmable integrated circuit includes programmable logic resources 504 and I/O pins 506. Power distribution lines 508 and 510 are placed in parallel alternating configuration. In this configuration, lines 508 and 510 are respectively joined at opposite ends of the integrated circuit. Decoupling capacitors (not shown) are implemented in a separate layer of the IC and coupled to the power distribution lines 508 and 510. It is understood that one or more embodiments of the present invention are equally applicable to different power distribution line grid arrangements. For example, power distribution lines 508 may be implemented in an IC layer different from the layer in which 510 is implemented and may have cross-hatched layout.

Figure 6:
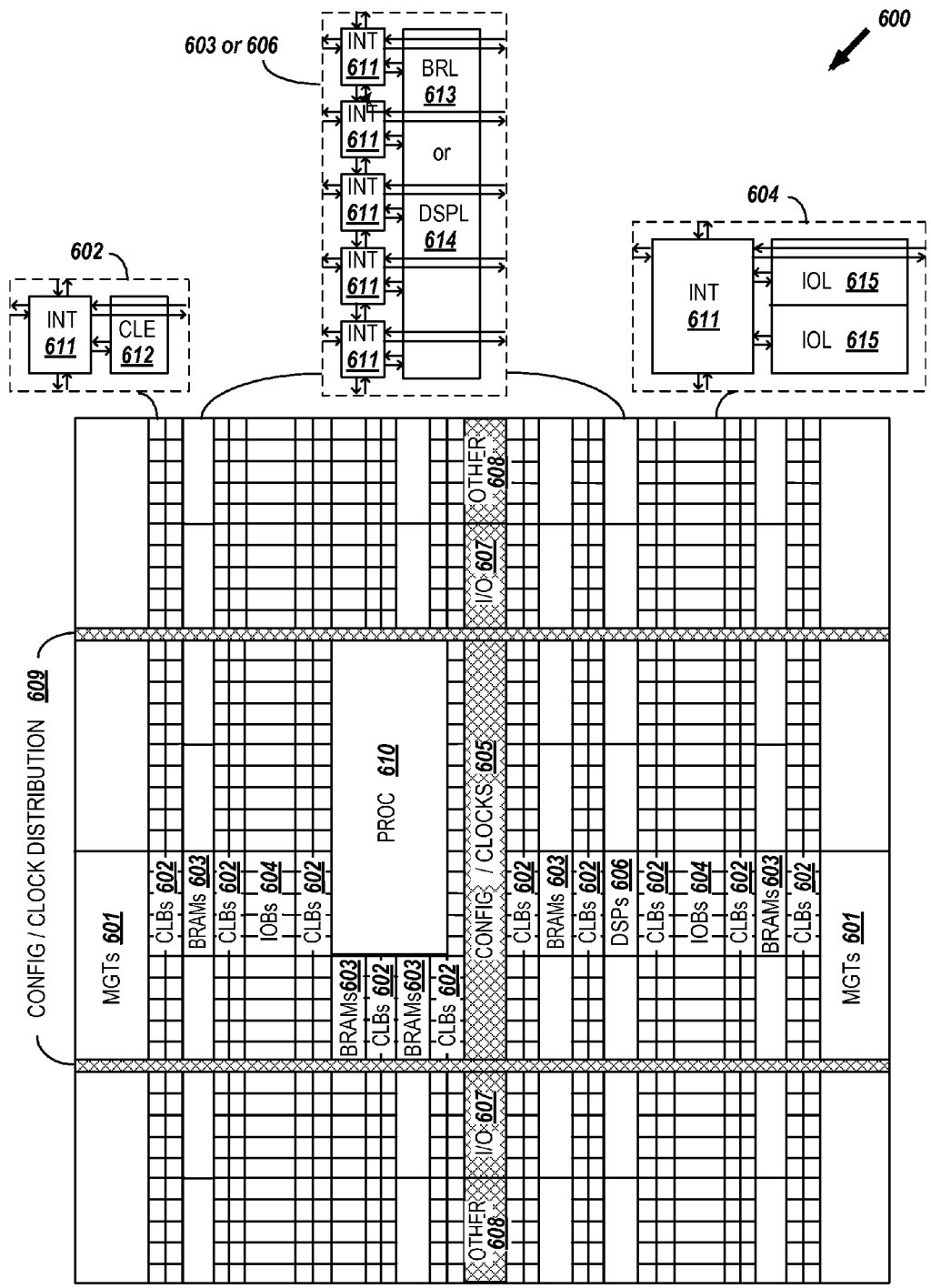
FIG. 6 illustrates an example field-programmable gate array (FPGA).

FIG. 6 is a block diagram of an example programmable integrated circuit that may implement a power distribution network. One particularly versatile programmable IC is a field programmable gate array (FPGA). FPGAs can include several different types of programmable logic blocks in the array. For example, FIG. 6 illustrates an FPGA architecture (600) that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607), for example, clock ports, and other programmable logic 608 such as digital clock managers, analog-to-digital converters, system monitoring logic, and so forth. Some FPGAs also include dedicated processor blocks (PROC 610) and internal and external reconfiguration ports (not shown).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA, more than one adjacent column of CLBs is typically included wherever the CLBs appear, to facilitate the efficient implementation of user logic.

The embodiments of the present invention are thought to be applicable to a variety of systems for power distribution. Other aspects and embodiments will be apparent to those skilled in the art from consideration of the specification. The embodiments may be utilized in conjunction with application specific integrated circuit (ASIC) or with programmable ICs. It is intended that the specification and illustrated embodiments be considered as examples only, with a true scope and spirit of the invention being indicated by the following claims.

What is claimed is:

1. An integrated circuit (IC), comprising:
 a first set of power distribution lines;
 a second set of power distribution lines;
 a first capacitor formed in the IC;
 a second capacitor formed in the IC; and
 a first plurality of vias coupling a first input of the first and second capacitors to the first set of power distribution lines, and
 a second plurality of vias coupling a second input of the first and second capacitors to the second set of power distribution lines;
 the first capacitor and the first plurality of vias and the second plurality of vias coupled thereto having an equivalent series resistance greater than an equivalent series resistance of the second capacitor and the first plurality of vias and the second plurality of vias coupled thereto.

2. The IC of claim 1, wherein:
 the first plurality of vias includes:
  a first subset of vias coupling the first set of power distribution lines to a first end of the first capacitor; and
  a second subset of vias coupling the first set of power distribution lines to a first end of the second capacitor;
 the second plurality of vias includes:
  a third subset of vias coupling the first set of power distribution lines to a second end of the first capacitor; and
  a fourth subset of vias coupling the first set of power distribution lines to a second end of the second capacitor;
 the first and third subsets of vias having an equal number of vias; and
 the second and forth subsets of vias having an equal number of vias.

3. The IC of claim 2, wherein the first capacitor includes:
 a first metal layer coupled to the first subset of vias;
 a second metal layer coupled to the third subset of vias; and
 a first dielectric layer formed between and adjacent to the first and second metal layers.

4. The IC of claim 3, wherein the first capacitor further includes:
a third metal layer coupled to the first subset of vias, the second metal layer located in between the first and third metal layers; and
a second dielectric layer formed between and adjacent to the second and third metal layers.

5. The IC of claim 1, wherein the first and second capacitors are metal-insulator-metal capacitors.

6. The IC of claim 1, wherein the first and second capacitors and vias coupled thereto provide a low impedance path between the first and second sets of power distribution lines over a wide frequency range.

7. The IC of claim 1, wherein one or more of the first plurality of vias are coupled to the first set of power distribution lines via fuses.

8. The IC of claim 7, wherein the equivalent series resistance is adjustable in response to burning out one or more of the fuses.

9. The IC of claim 1, wherein the first and second capacitors are field-effect transistors.

10. An integrated circuit (IC), comprising
a first set of power distribution lines;
a second set of power distribution lines;
a plurality of capacitors; and
a plurality of sets of vias, each set of vias having:
    one or more vias coupling a first end of a respective one of the plurality of capacitors to one or more of the first set of power distribution lines;
    one or more vias coupling a second end of the respective one of the plurality of capacitors to one or more of the second set of power distribution lines; and
    wherein each set in the plurality of sets of vias has a different number of vias.

11. The IC of claim 10, wherein the number of vias coupled to the first end of the respective one of the plurality of capacitors is equal to the number of vias coupled to the second end of the respective one of the plurality of capacitors.

12. The IC of claim 10, wherein each of the plurality of capacitors has a different capacitance.

13. The IC of claim 10, wherein the plurality of capacitors are metal-insulator-metal capacitors.

14. The IC of claim 10, wherein the plurality of capacitors are field-effect transistors.

15. The IC of claim 10, wherein the plurality of capacitors and vias coupled thereto provide a low impedance path between the first and second sets of power distribution lines over a wide frequency range.

16. The IC of claim 10, wherein one or more of the plurality of sets of vias are coupled to the first set of power distribution lines via fuses.

17. A method of fabricating an integrated circuit, comprising:
forming a first set of power distribution lines in a semiconductor substrate;
forming a second set of power distribution lines in the semiconductor substrate;
forming a first capacitor in the semiconductor substrate;
forming a second capacitor in the semiconductor substrate; and
forming a first plurality of vias coupling a first input of the first and second capacitors to the first set of power distribution lines, and
forming a second plurality of vias coupling a second input of the first and second capacitors to the second set of power distribution lines,
the first capacitor and the first plurality of vias and the second plurality of vias coupled thereto having an equivalent series resistance greater than an equivalent series resistance of the second capacitor and the first plurality of vias and the second plurality of vias coupled thereto.

18. The method of claim 17, wherein:
forming the first plurality of vias in the semiconductor substrate includes:
    forming a first set of vias in the substrate, the first set of vias coupling the first set of power distribution lines to a first end of the first capacitor; and
    forming a second set of vias in the substrate, the second set of vias coupling the first set of power distribution lines to a first end of the second capacitor;
forming the second plurality of vias includes:
    forming a third set of vias in the substrate, the third set of vias coupling the second set of power distribution lines to a second end of the first capacitor; and
    forming a fourth set of vias in the substrate, the fourth set of vias coupling the second set of power distribution lines to a second end of the second capacitor;
the first and third sets of vias having an equal number of vias; and
the second and fourth sets of vias having an equal number of vias.

19. The method of claim 17, wherein the first and second capacitors are metal-insulator-metal capacitors.

20. The method of claim 17, wherein the first and second capacitors are field-effect transistors.

* * * * *